United States Patent
Kozaki

(10) Patent No.: US 7,073,098 B2
(45) Date of Patent: Jul. 4, 2006

(54) MULTI-PHASE CLOCK GENERATION CIRCUIT AND CLOCK MULTIPLICATION CIRCUIT

(75) Inventor: Minoru Kozaki, Suwa (JP)

(73) Assignee: Seiko Epson Corporation (JP)

( * ) Notice: Subject to any disclaimer, the term of this patent is extended or adjusted under 35 U.S.C. 154(b) by 502 days.

(21) Appl. No.: 10/367,991

(22) Filed: Feb. 14, 2003

(65) Prior Publication Data

US 2003/0188235 A1    Oct. 2, 2003

(30) Foreign Application Priority Data

Feb. 21, 2002    (JP) ............... 2002-045243

(51) Int. Cl.
*G06K 5/04* (2006.01)
(52) U.S. Cl. .......................... 714/700; 327/2
(58) Field of Classification Search ........ 327/147–161, 327/2–3; 714/100
See application file for complete search history.

(56) References Cited

U.S. PATENT DOCUMENTS

| | | | |
|---|---|---|---|
| 5,663,665 A * | 9/1997 | Wang et al. ............... 327/3 |
| 6,329,854 B1 * | 12/2001 | Lee et al. ............... 327/158 |
| 6,414,526 B1 | 7/2002 | Guinea et al. | |
| 6,556,488 B1 * | 4/2003 | Han ........................ 365/194 |
| 6,628,154 B1 * | 9/2003 | Fiscus ..................... 327/158 |
| 2002/0041196 A1 * | 4/2002 | Demone et al. ......... 327/158 |
| 2003/0141910 A1 * | 7/2003 | Reindl .................... 327/158 |
| 2004/0000937 A1 * | 1/2004 | Byun et al. ............. 327/158 |

FOREIGN PATENT DOCUMENTS

JP    2000 022524    2/2000
JP    2000 224029    8/2000

* cited by examiner

*Primary Examiner*—Albert Decady
(74) *Attorney, Agent, or Firm*—Harness, Dickey & Pierce, P.L.C.

(57) ABSTRACT

A circuit is provided to prevent improper locking of a DLL circuit without providing any limitation to the reference clock frequency. By detecting the time difference between edges of multi-phase clocks Ck1–Ck6, a delay time detection signal DT1 corresponding to a delay time $5\tau$ from the multi-phase clock Ck1 to the multi-phase clock Ck6 is generated. An Up1 signal is forcibly output to a charge pump circuit CP1 based on this delay time detection signal DT1, and the output of a Down1 signal is suppressed.

15 Claims, 12 Drawing Sheets

[FIG. 1]
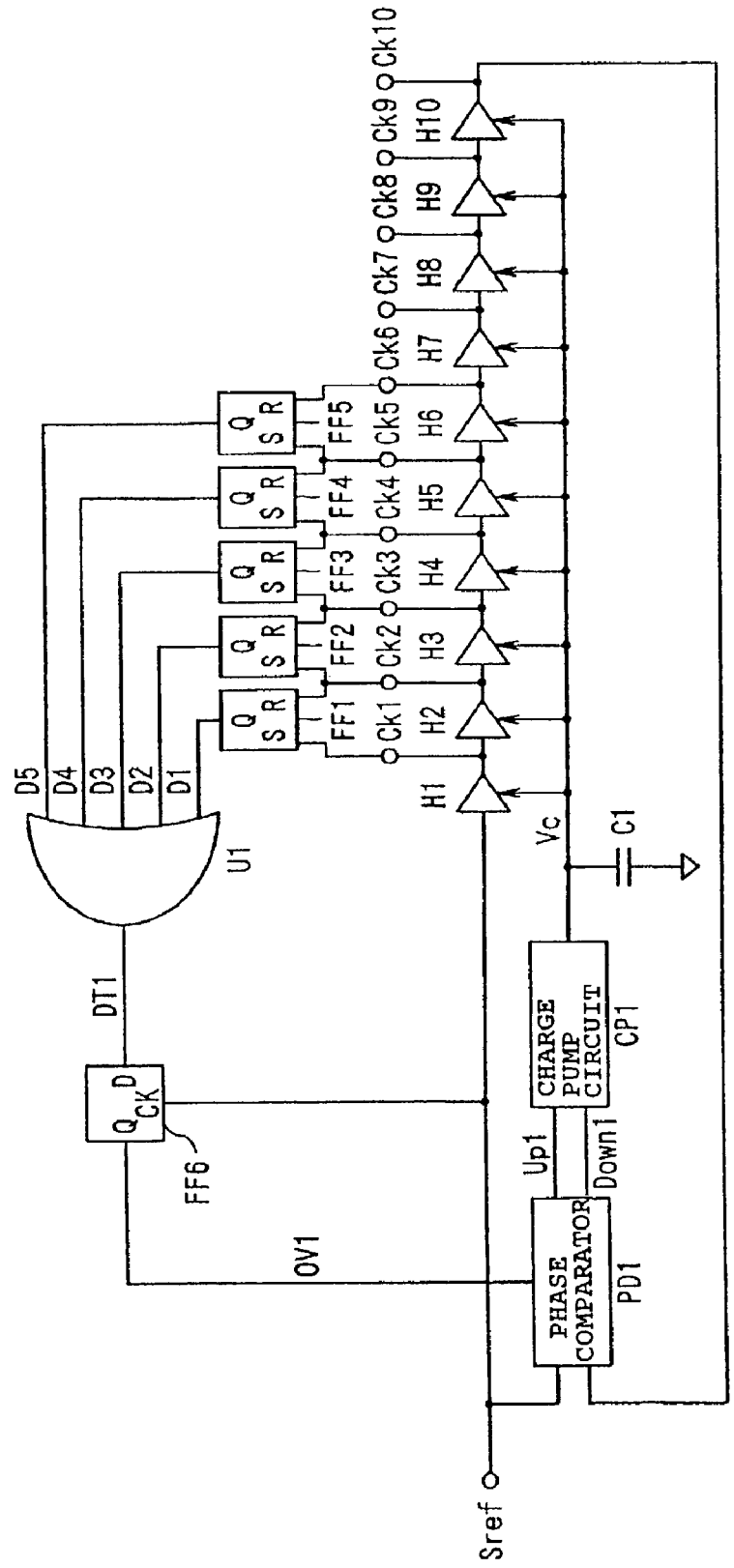

[FIG. 2]
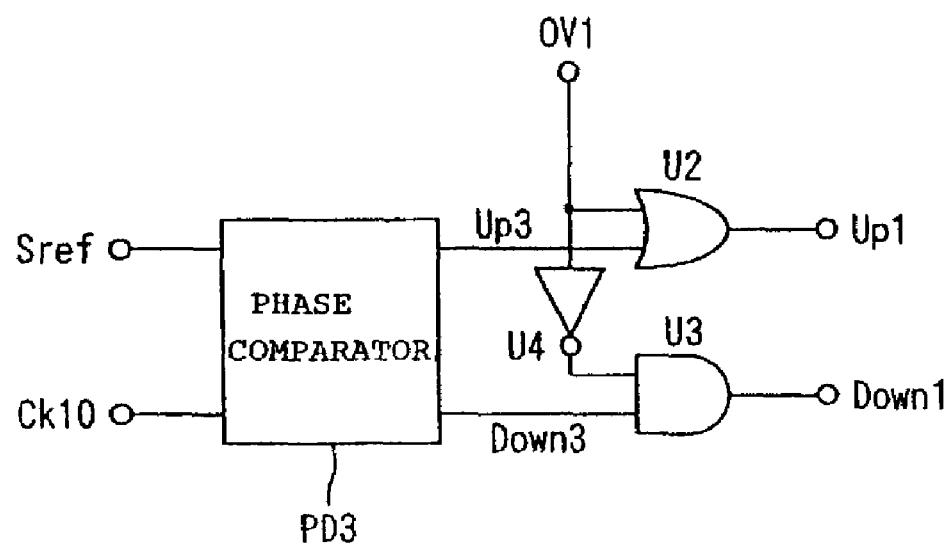

[FIG. 3]
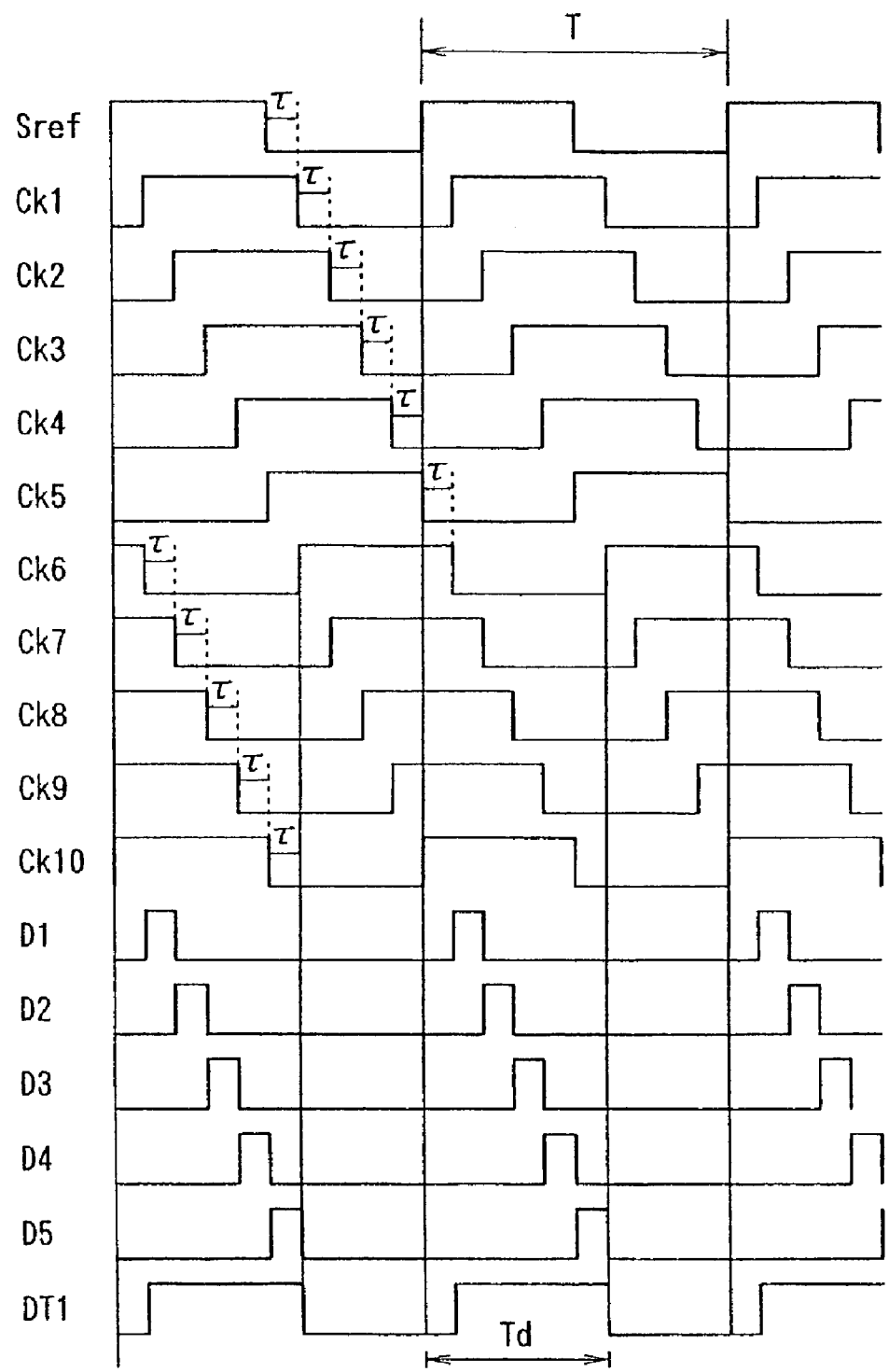

[FIG. 4]
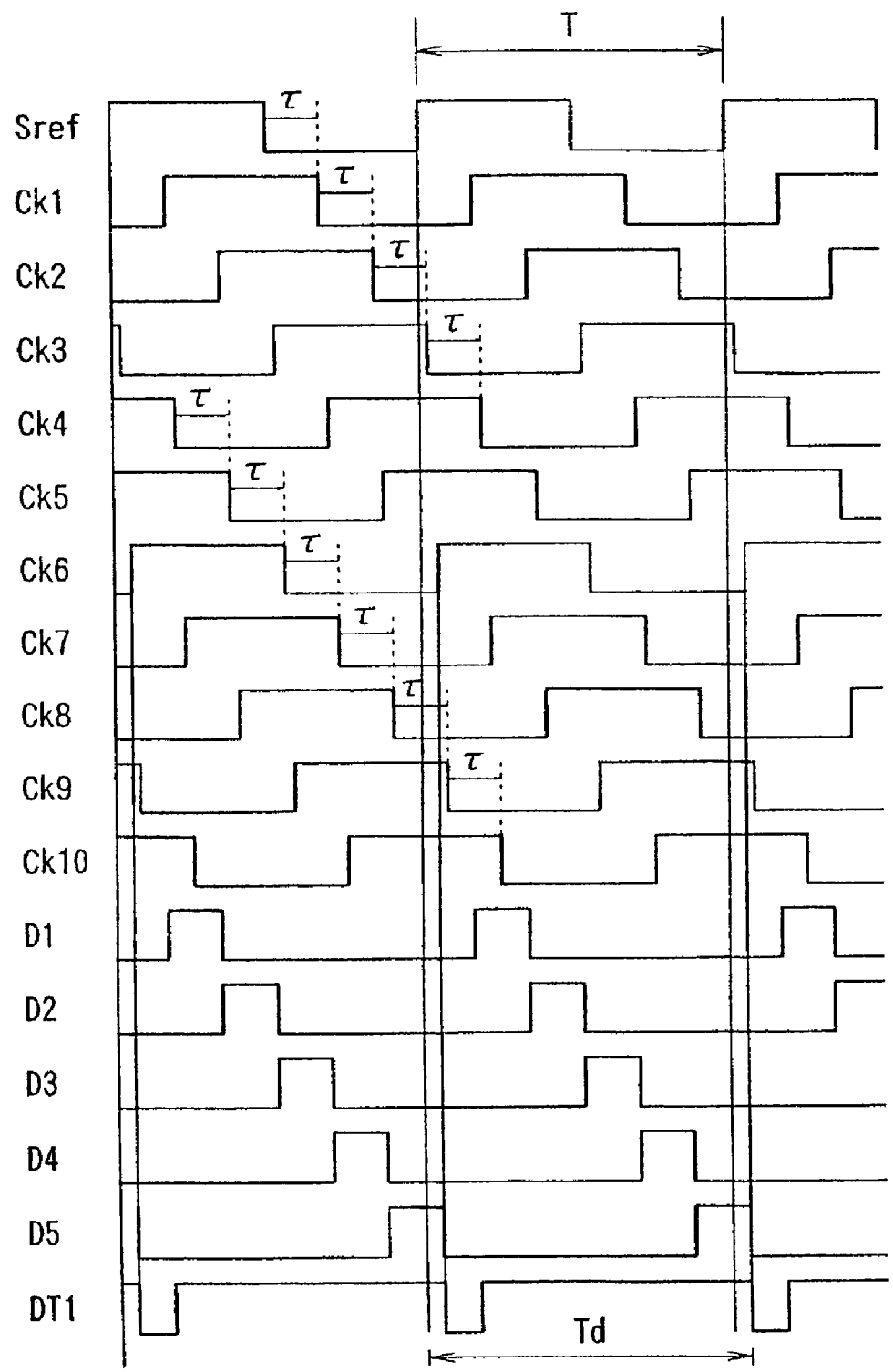

[FIG. 5]
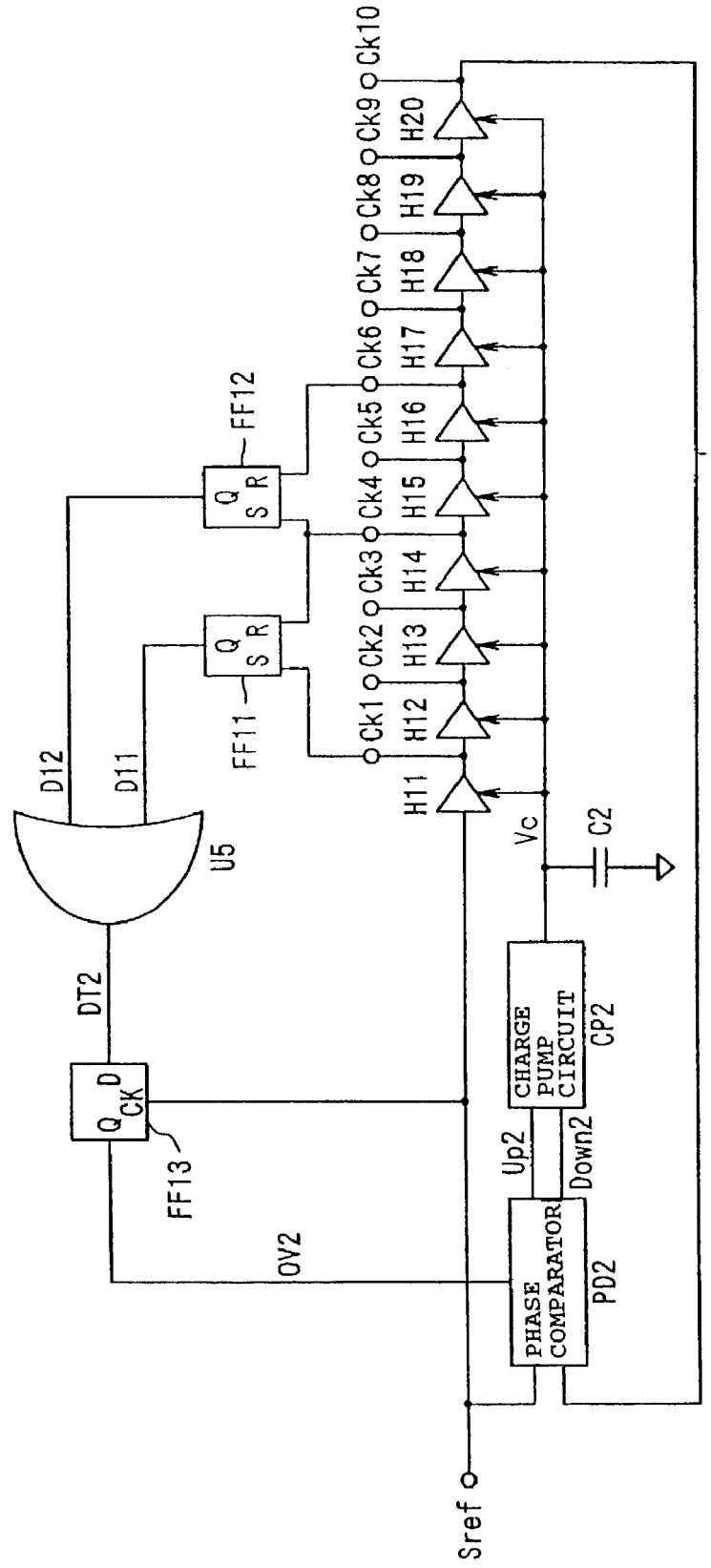

[FIG. 6]
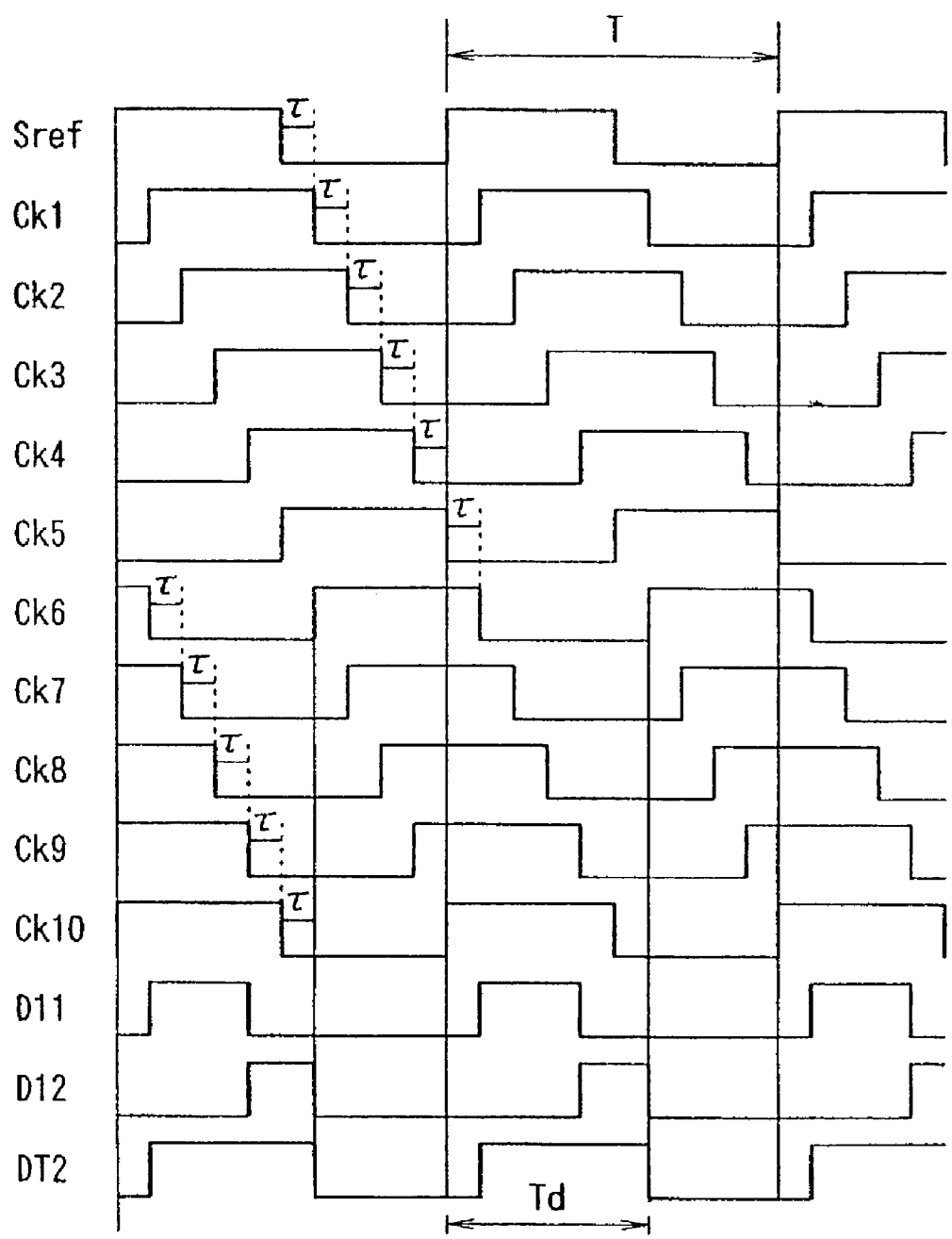

[FIG. 7]
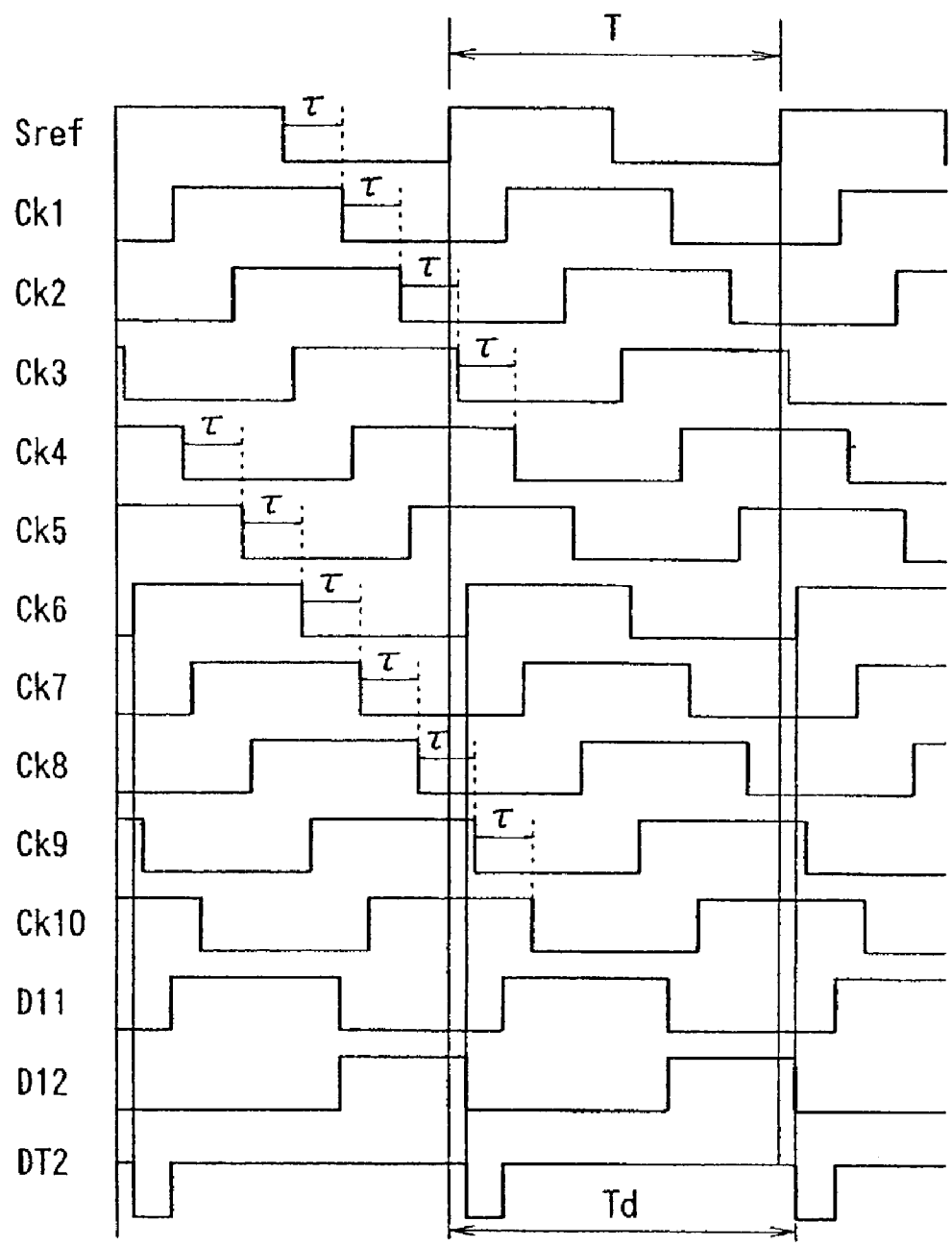

[FIG. 8]
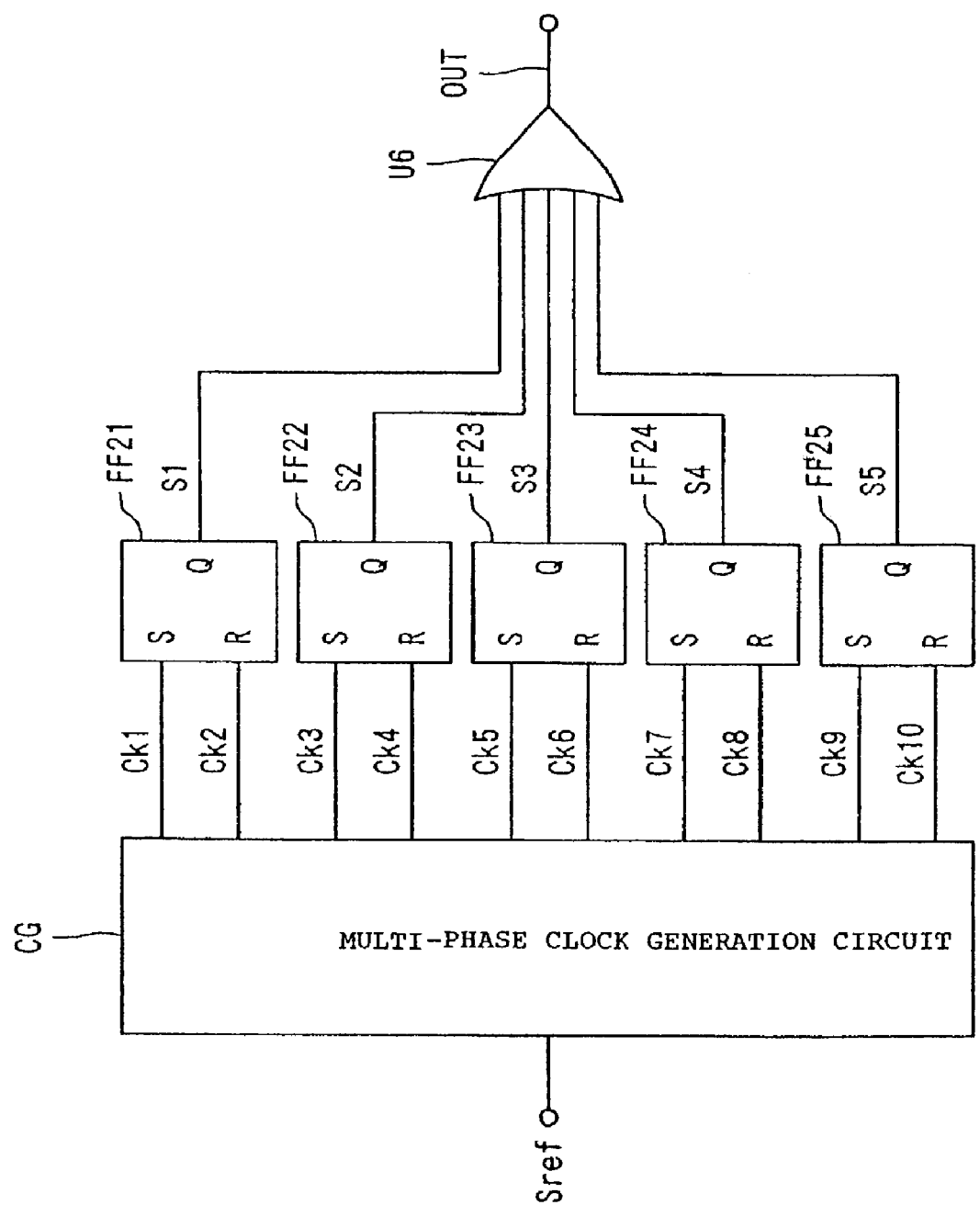

[FIG. 9]
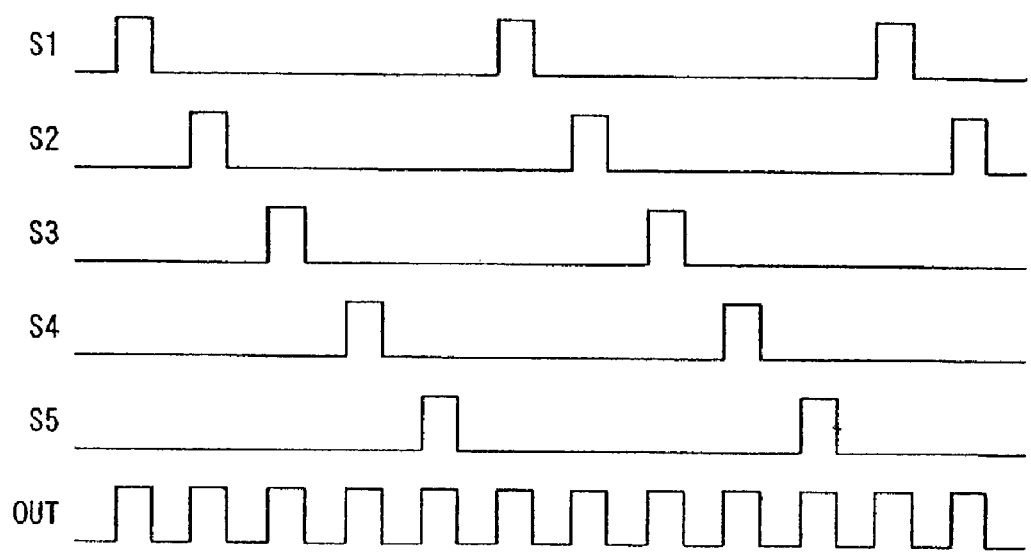

[FIG. 10]
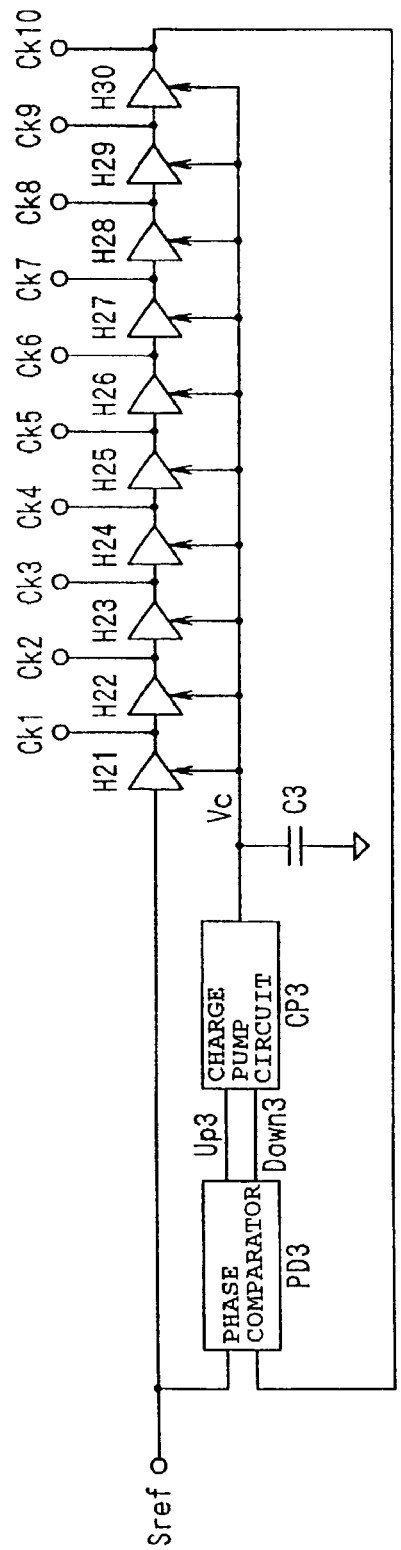

[FIG. 11]
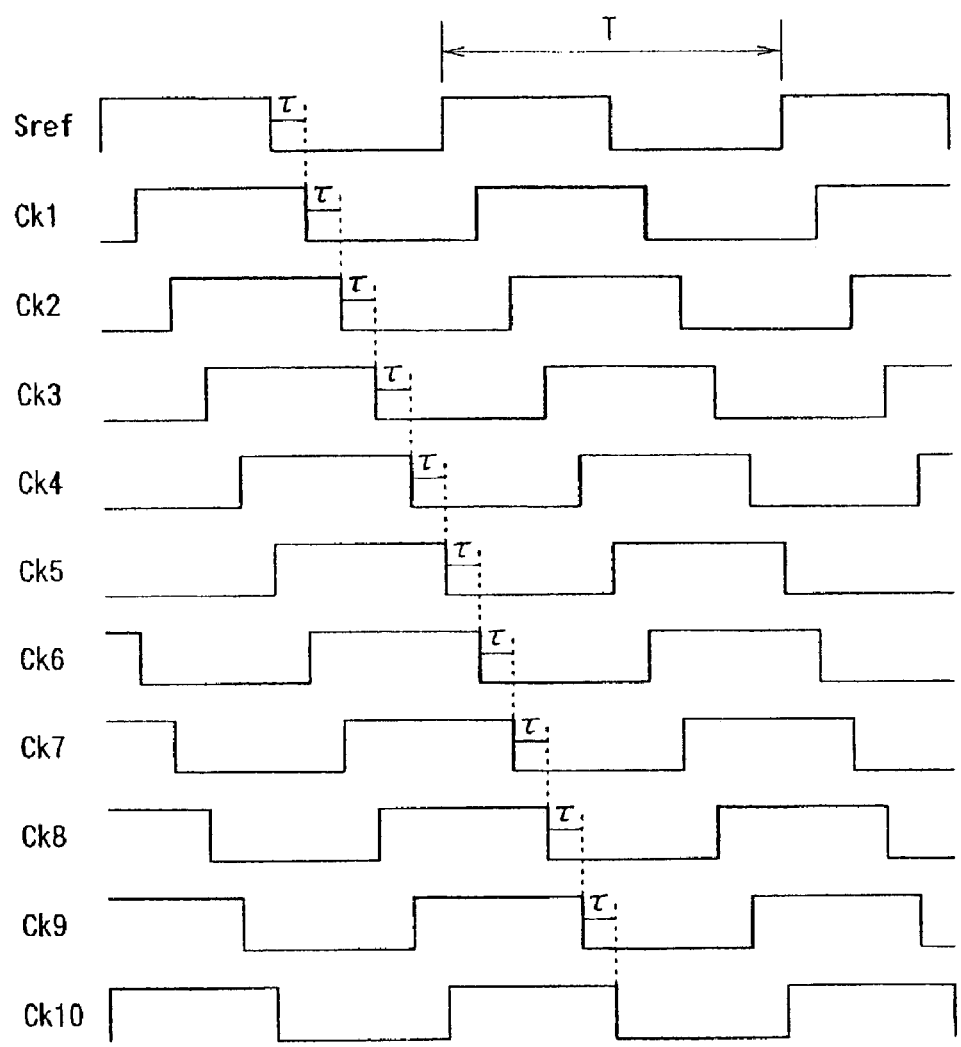

[FIG. 12]
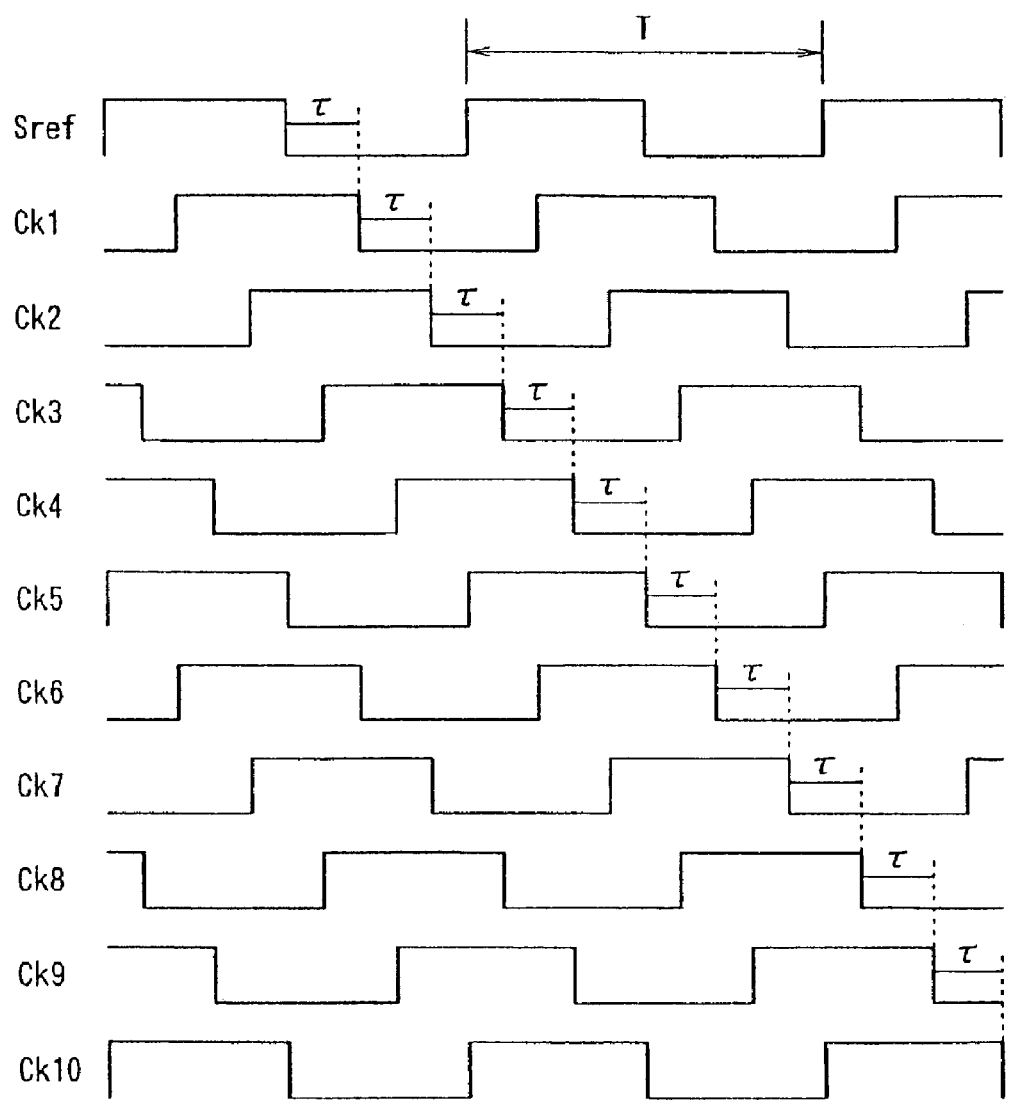

MULTI-PHASE CLOCK GENERATION CIRCUIT AND CLOCK MULTIPLICATION CIRCUIT

TECHNICAL FIELD

The present invention relates to a multi-phase clock generation circuit and a clock multiplication circuit, and more specifically, the invention relates to a circuit particularly applicable to a DLL (Delay Locked Loop) circuit.

BACKGROUND

A conventional clock multiplication circuit obtains the multiplied clock by performing waveform synthesis of multi-phase clocks. Here, the multi-phase clocks mean N sets of clock signals with edges shifted by T/N relative to each other, where T is the period of the multi-phase clocks. The multi-phase clock generation circuit consists of a system using a PLL circuit or a system using a DLL circuit.

In a system using the PLL circuit, a ring oscillator is required for generating the multi-phase clocks. As such, problems occur in that the PLL circuit is adversely affected by low frequency noise inherent to the ring oscillator, and jitter (variance in clock period) may be generated in the multi-phase clocks. For this purpose, it is desirable to use a DLL circuit in order to suppress the jitter of the multiphase clocks.

FIG. 10 is a block diagram showing an example of the configuration of a conventional multi-phase clock generation circuit using a DLL circuit, and FIG. 11 is a timing chart describing the operation in the normal locking state of a conventional multi-phase clock generation circuit, respectively. The multi-phase clock generation circuit in FIG. 10 shows a case of N=10. In FIG. 10, the conventional multi-phase clock generation circuit comprises a phase detector PD3, a charge pump circuit CP3, a capacitor C3 and voltage control delay elements H21–H30. The voltage controlled delay elements H21–H30 are connected in cascade, multi-phase clocks Ck1–Ck10 are output from each of the voltage controlled delay elements H21–H30, a reference clock Sref is input to the voltage controlled delay element H21 on the first stage, and the multi-phase clock Ck10 output from the voltage controlled delay element H30 on the last stage is fed back to the phase detector PD3.

The multi-phase clock Ck10 fed back to the phase detector PD3 is compared with the reference clock Sref in the phase detector PD3, and an Up3 signal or a Down3 signal is output to the charge pump circuit CP3 according to the phase difference between the multi-phase clock Ck10 and the reference clock Sref. In the charge pump circuit CP3, when the Up3 signal is output, charges are accumulated in a capacitor C3, and when the Down3 signal is output, charges accumulated in the capacitor C3 are discharged. The charge pump circuit CP3 generates the control voltage Vc corresponding to the accumulation of charges in the capacitor C3, and outputs this control voltage Vc to each of the voltage controlled delay elements H21–H30.

Here, in each of the voltage controlled delay elements H21–H30, the delay time τ is changed by the control voltage Vc, and the delay time τ of the each of the voltage controlled delay elements H21–H30 is locked to T/10 by matching the phase of the multi-phase clock Ck10 with the phase of the reference clock Sref. As a result, the multi-phase clocks Ck1–Ck10 for ten phases with edges thereof shifted from each other by T/10 can be generated as shown in FIG. 11.

When the delay time τ of each of the voltage controlled delay elements H21–H30 is controlled so that the phase of the multi-phase clock Ck10 matches the phase of the reference clock Sref, the delay time τ of each of the voltage controlled delay elements H21–H30 can be locked not only to T/10, but also to n·T/10 (n: an integer of 2 or more). Thus, when the maximum number τmax of the delay time τ of each of the voltage controlled delay elements H21–H30 exceeds n·T/10, the phase shift of the multi-phase clocks may not be locked to T/10, but may be improperly locked to n·T/10.

FIG. 12 is a timing chart describing the operation in the improper locking state of a conventional multi-phase clock generation circuit. In FIG. 12, though the phase of the multi-phase clock Ck10 matches the phase of the reference clock Sref, the delay time τ of each of the voltage controlled delay elements H21–H30 is locked to 2T/10. As a result, the shift of the edge of the multi-phase clocks Ck1–Ck10 is not locked to T/10, but is improperly locked to 2T/10. When the shift of the edge of the multi-phase clocks Ck1–Ck10 is improperly locked to 2T/10, the desired multiplied clock cannot be acquired.

Thus, in the conventional DLL circuit, improper locking is generally prevented by setting the frequency f (=I/T) of the reference clock Sref to be smaller than 2/(N·τmax), and preventing the possible maximum number τmax of the delay time τ of each of the voltage controlled delay elements H21–H30 from exceeding 2T/10. However, if the frequency f of the reference clock Sref is limited in order to prevent improper locking, circuits which are different from each other must be designed according to the operating frequency, and a problem occurs in that it is difficult to use one DLL circuit in various kinds of applications.

Thus, one object of the present invention is to provide a multi-phase clock generation circuit and a clock multiplication circuit capable of preventing improper locking while mitigating the limitation imposed on the reference clock frequency.

SUMMARY

In order to solve above problems, a multi-phase clock generation circuit according to one aspect is characterized in that it comprises voltage controlled delay elements of N stages connected in cascade, a delay time control means for controlling the delay time of the output signal of each stage of the voltage controlled delay elements so that the phase of the output signal from the N-th stage of the voltage controlled delay elements matches the phase of the reference clock input in the first stage, a delay time monitoring means for monitoring the delay time of the voltage controlled delay elements, and a locking condition control means for controlling the locking condition of the output signal of the voltage controlled delay elements based on the delay time monitoring result by the delay time monitoring means.

Thus, even when the delay time of the output signal of each stage of the voltage controlled delay elements is controlled so that the phase of the output signal from the N-th stage of the voltage controlled delay elements matches with the phase of the reference clock, the locking condition of the output signals of the voltage control delay elements can be controlled by monitoring the delay time of the voltage controlled delay elements.

Therefore, improper locking can be prevented while mitigating the limitation imposed on the reference clock frequency, different circuit design need not be performed according to the operating frequency, and thus, the multi-phase clock generation circuit can be easily used in various kinds of applications.

Further, in the multi-phase clock generation circuit according to a second aspect, the locking condition control means is characterized in that the locking condition of the output signals of the voltage controlled delay elements can be controlled so that the total delay time of the N stages of the voltage controlled delay elements matches with one period of the reference clock.

Locking is thus prevented in a state in which the total delay of the N stages of the voltage controlled delay elements is n times (n=2, 3, 4, . . . ) of one period of the reference clock, locking can be performed in a state of one period of the reference clock, and improper locking can be prevented.

Still further, the multi-phase clock generation circuit according to a third aspect is characterized in that it comprises voltage controlled delay elements of N stages connected in cascade, a phase detector circuit for controlling the delay time of the output signal of each stage of the voltage controlled delay elements so that the phase of the output signal from the N-th stage of the voltage controlled delay elements matches with the phase of the reference clock input in the first stage thereof, a delay time detection circuit for detecting the delay time for K stages (K<N) of the voltage controlled delay elements, a delay time decision circuit for deciding whether or not the delay time detected by the delay time detection circuit is within one period of the reference clock, and a delay time reduction circuit for reducing the delay time to be controlled by the phase detector circuit when the delay time detected by the delay time detection circuit exceeds one period of the reference clock.

Thus, the delay time for K stages of the voltage controlled delay elements is prevented from exceeding one period of the reference clock to prevent improper locking even when the delay of the output signal of each stage of the voltage controlled delay elements is controlled so that the phase of the output signal from N-th stage of the voltage controlled delay elements matches the phase of the reference clock.

Thus, different circuit design need not be performed according to the operating frequency, and the multi-phase clock generation circuit can be easily used in various kinds of applications.

In the multi-phase clock generation circuit according to a fourth aspect, the delay time detection circuit is characterized to detect the period of delay time from the time the first pulse of the reference clock is input to the (i+1)-th voltage controlled delay element to the time the first pulse is output from the (i+K−1)-th voltage controlled delay element, and reduces the delay time to be controlled by the phase detector circuit when the second pulse following the first pulse is input to the i-th voltage controlled delay element during the detected period of delay.

Thus, by detecting the delay time of the reference clock output from the voltage controlled delay elements, the delay time of the voltage controlled delay elements can be limited to the predetermined value or under, the multi-phase clock generation circuit can be prevented from being locked in a state in which the delay time for K stages of the voltage controlled delay elements exceeds one period of the reference clock, and improper locking can be prevented while mitigating the limitation imposed on the reference clock frequency.

Further, in the multi-phase clock generation circuit according to a fifth aspect, the delay time detection circuit is characterized in that it comprises (K−1) sets of RS flip-flop circuits for detecting the delay time for each stage of the (K−1) stages from the (i+1)-th stage to the (i+K−1) stage of the voltage controlled delay elements, and an OR circuit for taking the logical sum of the delay time of each stage detected by the RS flip-flop circuits.

Accordingly, even when the delay time for K stages of the voltage controlled delay elements exceeds one period of the reference clock, the delay time for K stages of the voltage controlled delay elements can be correctly detected by only adding a simple circuit configuration, and improper locking can be readily prevented.

The multi-phase clock generation circuit according to a sixth aspect is characterized in that the maximum delay time for one set of the voltage controlled delay element is shorter than one period of the reference clock.

Accordingly, not only improper locking can be prevented while mitigating the limitation imposed on the reference clock frequency, but also locking in another operation mode can be prevented.

The multi-phase clock generation circuit according to a seventh aspect is characterized in that the delay time detection circuit comprises M sets of the RS flip-flop circuits for detecting the delay time for groups in which the voltage controlled delay elements of the (K−1) stages are divided into M sets ($1 \leq M < K-1$), and an OR circuit for taking the logical sum of the delay time of each group detected by the RS flip-flop circuits.

Thus, the delay time for K stages of the voltage controlled delay elements can be detected while simplifying the circuit configuration, and improper locking can be readily prevented.

In addition, the multi-phase clock generation circuit according to an eighth aspect is characterized in that the maximum delay time for one set of the groups is shorter than one period of the reference clock.

Accordingly, not only improper locking can be prevented while mitigating any limitation imposed on the reference clock frequency, but also locking in another operation mode can be prevented while simplifying the circuit configuration.

Further, the multi-phase clock generation circuit according to a ninth aspect is characterized in that the delay time decision circuit comprises a D flip-flop for latching the output of the OR circuit in synchronization with the pulses input to the i-th voltage controlled delay element.

Accordingly, by adding a simple circuit configuration, it can be easily decided whether or not the delay time for K stages of the voltage controlled delay elements is within one period of the reference clock, and if the delay time for K stages of the voltage controlled delay elements exceeds one period of the reference clock once, the delay time detection signal output from the OR circuit can last for one period of the reference clock, forcing the multiphase clock generation circuit to lock in a normal condition.

The multi-phase clock generation circuit according to a tenth aspect is characterized in that the delay time reduction circuit continues reducing the delay time controlled by the phase detector circuit for a period in which the output of the D flip-flop is at a high level.

Thus, when the delay time for K stages of the voltage controlled delay elements exceeds one period of the reference clock, the delay time of the voltage controlled delay elements can be reduced, the delay time of the voltage controlled delay elements is limited to the predetermined value or under, and improper locking can be readily prevented.

The multi-phase clock generation circuit according to an eleventh aspect is characterized in that K is larger than N/2.

Thus, the delay time for K stages of the voltage controlled delay elements can exceed one period of the reference clock before entering an improper locking state, and improper locking can be prevented even when the delay time of the voltage controlled delay elements for each stage is small.

Further, a clock multiplication circuit according to a twelfth aspect is characterized in that it comprises a multi-phase clock generation circuit for generating multi-phase clocks, and a multiplied clock generation circuit for generating the multiplied clock based on the multi-phase clocks, the multi-phase clock generation circuit comprises voltage controlled delay elements of N stages connected in cascade, a phase detector circuit for controlling the delay time of the output signal of each stage of the voltage controlled delay elements so that the phase of the output signal from the N-th stage of the voltage controlled delay elements matches with the phase of the reference clock, a delay time detection circuit for detecting the delay time for K (K<N) stages of the voltage controlled delay elements, a delay time decision circuit for deciding whether or not the delay time detected by the delay time detection circuit is within one period of the reference clock, and a delay time reduction circuit for reducing the delay time to be controlled by the phase detector circuit when the delay time detected by the delay time detection circuit exceeds one period of the reference clock.

In addition, in the above first embodiment, the description was made on a method for detecting the delay time detection signal DT1 for five stages of voltage controlled delay elements H2–H6 by using five RS flip-flop circuits FF1–FF5 to generate five clock signals D1–D5, but the number of the stages of the voltage controlled delay elements H2–H6 for detecting the delay time detection signal DT1 need not be limited to five, and the number of the stages may be, for example, between five and eight.

Accordingly, the delay time of the voltage controlled delay elements can be limited to the predetermined value or under, and improper locking can be prevented while mitigating the limitation imposed on the reference clock frequency. As a result, the clock multiplication circuit operable at various kinds of frequencies can be constituted without changing the design of the multi-phase clock generation circuit.

In addition, jitter can be suppressed because no ring oscillator is used, and the multiplied clock of high quality can be readily generated.

BRIEF DESCRIPTION OF THE DRAWINGS

FIG. 1 is a block diagram showing the configuration of a multi-phase clock generation circuit according to a first embodiment of the present invention.

FIG. 2 is a block diagram showing the configuration of a phase detector according to an embodiment of the present invention.

FIG. 3 is a timing chart describing the operation of the multi-phase clock generation circuit according to the first embodiment of the present invention in a normal locking state.

FIG. 4 is a timing chart describing the operation of the multi-phase clock generation circuit according to the first embodiment of the present invention in an unlocking state.

FIG. 5 is a block diagram showing the configuration of a multi-phase clock generation circuit according to a second embodiment of the present invention.

FIG. 6 is a timing chart describing the operation of the multi-phase clock generation circuit according to the second embodiment of the present invention in a normal locking state.

FIG. 7 is a timing chart describing the operation of the multi-phase clock generation circuit according to the second embodiment of the present invention in an unlocking state.

FIG. 8 is a block diagram showing the configuration of a clock multiplication circuit according to an embodiment of the present invention.

FIG. 9 is a timing chart showing the operation of the clock multiplication circuit according to an embodiment of the present invention.

FIG. 10 is a block diagram showing the configuration of a conventional multi-phase clock generation circuit.

FIG. 11 is a timing chart describing the operation of a conventional multi-phase clock generation circuit in the normal locking state.

FIG. 12 is a timing chart describing the operation of a conventional multi-phase clock generation circuit in an improper locking state.

DETAILED DESCRIPTION

A multi-phase clock generation circuit and a clock multiplication circuit according to the embodiment of the present invention will be described below with reference to drawings.

FIG. 1 is a block diagram showing the configuration of the multi-phase clock generation circuit according to the first embodiment of the present invention. In FIG. 1, the multi-phase clock generation circuit comprises a phase detector PD1, a charge pump circuit CP1, a capacitor C1, and voltage controlled delay elements H1–H10 to constitute a DLL circuit, and further comprises RS flip-flop circuits FF1–FF5, an OR circuit U1, and a D flip-flop FF6. The voltage controlled delay elements H1–H10 are connected in cascade, multi-phase clocks Ck1–Ck10 are output from each of the voltage controlled delay elements H1–H10, the reference clock Sref is input to the voltage controlled delay element H1 on the first stage, and the multi-phase clock Ck10 output from the voltage controlled delay element H10 is fed back to the phase detector PD1.

In addition, the multi-phase clocks Ck1 and Ck2 output from the voltage controlled delay elements H1 and H2 are respectively input to S and R input terminals of an RS flip-flop circuit FF1, the multi-phase clocks Ck2 and Ck3 output from the voltage controlled delay elements H2 and H3 are respectively input to S and R input terminals of an RS flip-flop circuit FF2, multi-phase clocks Ck3 and Ck4 output from the voltage controlled delay elements H3 and H4 are respectively input to the S and R input terminals of an RS flip-flop circuit FF3, multi-phase clocks Ck4 and Ck5 output from the voltage controlled delay elements H4 and H5 are respectively input to the S and R input terminals of an RS flip-flop circuit FF4, multi-phase clocks Ck5 and Ck6 output from the voltage controlled delay elements H5 and H6 are respectively input to the S and R input terminals of an RS flip-flop circuit FF5, and the pulse signals D1–D5 output from each of the RS flip-flop circuits FF1–FF5 are input to the OR circuit U1.

A delay time detection signal DT1 output from the OR circuit U1 is input to a D input terminal of the D flip-flop FF6, the reference clock Sref is input to a clock terminal CK of the D flip-flop FF6, and a control signal OV1 is input to the phase detector PD1 from a Q output terminal of the D flip-flop FF6. The multiphase clock Ck10 fed back to the phase detector PD1 is compared with the reference clock Sref in the phase detector PD1, and an Up1 signal or a Down1 signal is output to the charge pump circuit CP1 according to the phase difference between the multiphase clock Ck10 and the reference clock Sref.

For example, the phase detector PD1 outputs the Up1 signal if the edge of the multi-phase clock Ck10 is delayed with respect to the edge of the reference clock Sref, or outputs the Down1 signal if the edge of the multi-phase clock Ck10 is advanced with respect to the edge of the reference clock Sref. If the Up1 signal is output, the charge pump circuit CP1 charges the capacitor C1, or if the Down1 signal is output, the charge pump circuit CP1 discharges the capacitor C1. Thus, the charge pump circuit CP1 generates the control voltage Vc corresponding to the charge in the capacitor C1, and outputs this control voltage Vc to each of the voltage controlled delay elements H1–H10.

Here, the delay time $\tau$ of each of the voltage controlled delay elements H1–H10 is changed by the control voltage Vc, and the delay time $\tau$ of each of the voltage controlled delay elements H1–H10 is locked to T/10 by matching the phase of the multi-phase clock Ck10 with the phase of the reference clock Sref. As a result, the multi-phase clocks Ck1–Ck10 for ten phases with the edges thereof shifted from each other by T/10 are output from each of the voltage controlled delay elements H1–H10.

Further, the pulse signal D1 having a width corresponding to the time difference between the edges of the multi-phase clocks Ck1 and Ck2 is output from the RS flip-flop circuit FF1, the pulse signal D2 having a width corresponding to the time difference between the edges of the multi-phase clocks Ck2 and Ck3 is output from the RS flip-flop circuit FF2, the pulse signal D3 having a width corresponding to the time difference between the edges of the multi-phase clocks Ck3 and Ck4 is output from the RS flip-flop circuit FF3, the pulse signal D4 having a width corresponding to the time difference between the edges of the multi-phase clocks Ck4 and Ck5 is output from the RS flip-flop circuit FF4, and the pulse signal D5 having a width corresponding to the time difference between the edges of the multi-phase clocks Ck5 and Ck6 is output from the RS flip-flop circuit FF5.

The logical sum of the pulse signals D1–D5 output from each of the RS flip-flop circuits FF1–FF5 is taken by the OR circuit U1, and a delay time detection signal DT1 having a pulse width corresponding to $5\tau$ which is the delay time from the multi-phase clock Ck1 to the multi-phase clock Ck6 is generated. The delay time detection signal DT1 generated by the OR circuit U1 is output to the D flip-flop FF6, and the delay time detection signal DT1 is latched in synchronization with the reference clock Sref.

When the delay time detection signal DT1 is latched by the D flip-flop FF6, the control signal OV1 depending on the delay time detection signal DT1 is output to the phase detector PD1, and the output of the Up1 signal and the Down1 signal generated by the phase detector PD1 is controlled. For example, when the delay time $\tau$ of the multi-phase clocks Ck1–Ck10 is increased, and gets closer to a locking state with the total delay twice of the period T of the reference clock, the time difference of the edges of the multi-phase clocks Ck1–Ck6 is increased, and the width of the pulse signals D1–D5 output from each of the RS flip-flop circuits FF1–FF5 is also increased. Thus, the width of the delay time detection signal DT1 output from the OR circuit U1 is also increased, the delay time detection signal DT1 is latched in synchronization with the reference clock Sref, and the control signal OV1 is output from the D flip-flop FF6.

If it is assumed that the larger the control voltage Vc is, the shorter the delay time $\tau$ of each of the voltage controlled delay elements H1–H10 is, the phase detector PD1 forcibly outputs the Up1 signal to the charge pump circuit CP1, suppresses the output of the Down1 signal, and increases the control voltage Vc output from the charge pump circuit CP1 when the control signal OV1 is output from the D flip-flop FF6. As a result, the delay time $\tau$ of each of the voltage controlled delay elements H1–H10 is decreased, and 10T which is the total of the delay time $\tau$ of each of the voltage controlled delay elements H1–H10 gets closer to the period T of the reference clock Sref.

Thus, locking to the period of n (n=2, 3, 4, . . . ) times of the period T of the reference clock is prevented to enable the locking to the period T of the reference clock, and improper locking can be prevented without limiting the frequency f (=1/T) of the reference clock.

FIG. 2 is a block diagram showing the configuration of the phase detector PD1 in FIG. 1. In FIG. 2, the phase detector PD1 comprises an OR circuit U2, an inverter U4 and an AND circuit U3 in addition to a phase detector PD3 in FIG. 10. Here, the control signal OV1 is input to the OR circuit U2, an Up3 signal from the phase detector PD3 is input thereto, the control signal OV1 is input to the AND circuit U3 via the inverter U4, and a Down3 signal from the phase detector PD3 is input thereto.

When the control signal OV1 is at a high level, the Up1 signal is at a high level, and the Down1 signal is at a low level. The Up1 signal can be forcibly output to thereby charge pump circuit CP1, and the output of the Down1 signal can be suppressed, the delay time $\tau$ of each of the voltage controlled delay elements H1–H10 is limited by only adding a simple circuit configuration to the phase detector PD3 in FIG. 10, and improper locking can be readily prevented.

FIG. 3 is a timing chart describing the operation of the multi-phase clock generation circuit according to the first embodiment of the present invention in the normal locking state. In FIG. 3, the delay time $\tau$ of each of the voltage controlled delay elements H1–H10 is controlled so that $10\tau$ which is the total of the delay time $\tau$ of each of the voltage controlled delay elements H1–H10 matches with the period T of the reference clock Sref.

Thus, the delay time $\tau$ of each of the voltage controlled delay elements H1–H10 is given by the formula $\tau=T/10$, and the width of the pulse signals D1–D5 output from each of the RS flip-flop circuits FF1–FF5 is also given by the formula $\tau=T/10$. Hence, the width of the delay time detection signal DT1 output from the OR circuit U1 is given by the formula $5\tau=5T/10$, and the time Td from the rise of the reference clock Sref to the fall of the delay time detection signal DT1 is given by the formula $6\tau=6T/10$.

On the other hand, the time of the present rise of the reference clock Sref to the next rise of the reference clock Sref is equal to the period T of the reference clock Sref. As a result, at the rise time of the reference clock Sref, the delay time detection signal DT1 is at a low level, and the control signal OV1 output from the D flip-flop FF6 is at a low level.

Thus, the Up3 signal and the Down3 signal output from the phase detector PD3 in FIG. 2 are output to the charge pump circuit CP1 without any change as the Up1 signal and the Down1 signal of the phase detector PD1 in FIG. 1, and the normal locking state can be maintained without any change.

FIG. 4 is a timing chart describing the operation of the multi-phase clock generation circuit according to the first embodiment of the present invention in the unlocking state.

In FIG. 4, the delay time τ of each of the voltage controlled delay elements H1–H10 is longer than T/10, and the multi-phase clock generation circuit is in an unlocked state. If the delay time τ becomes much longer, and reaches 2T/10, the phase detector PD1 cannot perform discrimination from the state in which the multiphase clock Ck10 is normally locked to the reference clock Sref, resulting in the possibility of improper locking as shown in FIG. 12.

However, as shown in FIG. 4, if the delay time τ of each of the voltage controlled delay elements H1–H10 exceeds T/6, the width τ of the pulse signals D1–D5 output from each of the RS flip-flop circuits FF1–FF5 also exceeds T/6, and the width of the delay time detection signal DT1 output from the OR circuit U1 satisfies an inequality of 5τ>5T/6. Thus, the time Td from the rise of the reference clock Sref to the fall of the delay time detection signal DT1 satisfies an inequality 6τ>6T/6=T. As a result, at the rise time of the reference clock Sref, the delay time detection signal DT1 is at a high level, and the control signal OV1 output from the D flip-flop FF6 is at a high level.

Accordingly, the high-level signal output from the D flip-flop FF6 is output to the charge pump circuit CP1 as the Up1 signal of the phase detector PD1 in FIG. 1 via the OR circuit U2 in FIG. 2, and the low-level signal obtained by inverting this high-level signal by an inverter U4 is output to the charge pump circuit CP1 as the Down1 signal of the phase detector PD1 in FIG. 1 via the AND circuit U3 in FIG. 2. Thus, the control voltage Vc is increased, the delay time τ of each of the voltage controlled delay elements H1–H10 starts to be shorter, and the multi-phase clock generation circuit gets closer to the normal locking state.

Further, if the delay time τ of each of the voltage controlled delay elements H1–H10 becomes shorter, the time Td from the rise of the reference clock Sref to the fall of the delay time detection signal DT1 becomes shorter than the period T of the reference clock Sref, so that the delay time detection signal DT1 is at a low level at the rise time of Sref, and the control signal OV1 is returned to a low level. Hence, the delay time τ of each of the voltage controlled delay elements H1–H10 does not exceed 2T/10, and the multi-phase clock generation circuit can be normally locked.

According to the first embodiment described above, the delay time 6τ of the voltage controlled delay elements H1–H6 can be detected by detecting the time difference between the edges of the multi-phase clocks Ck1–Ck6 for each stage, and improper locking can be prevented in advance. Thus, the frequency f (=1/T) of the reference clock Sref need not be smaller than 2/(N·τmax), and various frequencies can be input in the DLL circuit, and circuits that differ from each other according to the operating frequency need not be designed, and one DLL circuit can be used in various kinds of applications.

However, if the delay time τ of the voltage controlled delay elements H1–H10 is not less than the period T of the reference clock Sref, the operating waveform apparently cannot be discriminated from a case in which the delay time τ of the voltage controlled delay elements H1–H10 is shorter by the period T of the reference clock Sref. As such, an internal locking state in another operation mode can be possible even during the apparently normal locking state, and optimum operation must be performed in a plurality of operating modes. Thus, even when mitigating the frequency limit input in the DLL circuit, the frequency f is preferably limited so that at least the delay time τ of the voltage controlled delay elements H1–H10 does not exceed the period T of the reference clock Sref.

This means that the maximum value of the frequency f input in the DLL circuit is limited to 1/τmax. However, even in this case, the maximum value of the frequency f input in the DLL circuit can be expanded N/2 times compared with the configuration in FIG. 10, and the effect is left unchanged in that one DLL circuit can be used in various kinds of applications.

In addition, in the above first embodiment, the description was made on a method for detecting the delay time detection signal DT1 for five stages of voltage controlled delay elements H2–H6 by using five RS flip-flop circuits FF1–FF5 to generate five clock signals D1–D5, but the number of the stages of the voltage controlled delay elements H2–H6 for detecting the delay time detection signal DT1 need not to be limited to five, and the number of the stages may be, for example, between five and eight.

For example, the number of the stages for detecting the delay time detection signal DT1 is assumed to be six for the voltage controlled delay elements H2–H7 by adding one more RS flip-flop circuit and inputting multi-phase clocks Ck6 and Ck7 to the S and R terminals of the RS flip-flop circuit. In this case, the width of the delay time detection signal DT1 is 6τ, and the time Td from the rise of the reference clock Sref to the fall of the delay time detection signal DT1 becomes 7τ. As a result, when the delay time τ of each of the voltage controlled delay elements H1–H10 exceeds T/7, the delay time detection signal DT1 is at a high level at the rise time of the reference clock Sref, and the control signal OV1 is output to the phase detector PD1.

Thus, if the number of the stages of the voltage controlled delay elements H1–H10 for detecting the delay time detection signal DT1 is increased, the upper limit of the delay time τ of each of the voltage controlled delay elements H1–H10 can be limited more strictly, and the time Td from the rise of the reference clock Sref to the fall of the delay time detection signal DT1 can be increased up to 9τ. In addition, if the phase number of the multi-phase clock is N, the time Td from the rise of the reference clock Sref to the fall of the delay time detection signal DT1 can be increased up to (N−1)τ.

In another case, it is assumed the RS flip-flop circuits FF4 and FF5 are omitted, and the number of stages for detecting the delay time detection signal DT1 is set to be three of the voltage controlled delay elements H2–H4. In this case, the width of the delay time detection signal DT1 becomes 3τ, and the time Td from the rise of the reference clock Sref to the fall of the delay time detection signal DT1 becomes 4τ. As a result, until the delay time τ of the voltage controlled delay elements H1–H10 exceeds T/4, the delay time detection signal DT1 does not become a high level at the rise time of the reference clock Sref, and the control signal OV1 is not output to the phase detector PD1 until then.

Thus, even when the delay time τ of each of the voltage controlled delay elements H1–H10 reaches T/5, the control signal OV1 is not output to the phase detector PD1, resulting in the possibility of improper locking at τ=T/5. Accordingly, if the level of the delay time detection signal DT1 is detected at the rise time of the reference clock Sref, the number of the stages of the voltage controlled delay elements H1–H10 for detecting the delay time detection signal DT1 must be set so that the time Td is longer than 5τ before reaching the improper locking state. If the phase number of the multi-phase clock is N, the time Td from the rise of the reference clock Sref to the fall of the delay time detection signal DT1 must be at least (N/2)τ, and the number of stages of the voltage controlled delay elements H1–H10 for detecting the delay time detection signal DT1 must be no less than (N/2).

FIG. 5 is a block diagram indicating the configuration of a multi-phase clock generation circuit according to the second embodiment of the present invention. In FIG. 5, the multi-phase clock generation circuit comprises a phase detector PD2, a charge pump circuit CP2, a capacitor C2 and voltage controlled delay elements H11–H20 to constitute a DLL circuit, and further comprises RS flip-flop circuits FF11 and FF12, an OR circuit U5, and a D flip-flop FF13. The phase detector PD2 may have a configuration similar that shown in FIG. 2.

The voltage controlled delay elements H11–H20 are connected in cascade, multi-phase clocks Ck1–Ck10 are output from each of the voltage controlled delay elements H11–H20, the reference clock Sref is input to the voltage controlled delay element H1 on the first stage, and the multi-phase clock Ck10 output from the voltage controlled delay element H20 on the last stage is fed back to the phase detector PD2. In addition, the multi-phase clocks Ck1 and Ck4 output from the voltage controlled delay elements H11 and H14 are respectively input to S and R input terminals of the RS flip-flop circuit FF11, and the multi-phase clocks Ck4 and Ck6 output from the voltage controlled delay elements H14 and H16 are respectively input to the S and R input terminals of the RS flip-flop circuit FF12.

Further, the delay time detection signal DT2 output from an OR circuit U5 is input to the D input terminal of the D flip-flop FF13, the reference clock Sref is input to a clock terminal CK of the D flip-flop FF13, and the control signal OV2 is input to the phase detector PD2 from the Q output terminal of the D flip-flop FF13. The multi-phase clock Ck10 fed back to the phase detector PD2 is compared with the reference clock Sref in the phase detector PD2, and the Up2 signal or the Down2 signal is output to the charge pump circuit CP2 corresponding to the phase difference between the multi-phase clock Ck10 and the reference clock Sref.

If the Up2 signal is output, the charge pump circuit CP2 charges the capacitor C2, or if the Down 2 signal is output, the charge pump circuit CP2 discharges the capacitor C2. Thus, the charge pump circuit CP2 generates the control voltage Vc corresponding to the charge in the capacitor C2, and outputs this control voltage Vc to each of the voltage controlled delay elements H11–H20.

Here, the delay time $\tau$ of each of the voltage controlled delay elements H11–H20 is changed by the control voltage Vc, and the delay time $\tau$ of each of the voltage controlled delay elements H11–H20 is locked to T/10 by matching the phase of the multi-phase clock Ck10 with the phase of the reference clock Sref. As a result, the multi-phase clocks Ck1–Ck10 for ten phases with the phases thereof shifted from each other by T/10 are output from each of the voltage controlled delay elements H11–H20.

Further, the pulse signal D11 having a width corresponding to the time difference between the edges of the multi-phase clocks Ck11 and Ck14 is output from the RS flip-flop circuit FF11, and the pulse signal D12 having a width corresponding to the time difference between the edges of the multi-phase clocks Ck11 and Ck16 is output from the RS flip-flop circuit FF12. The logical sum of the pulse signals D11 and D12 output from each of the RS flip-flop circuits FF11 and FF12 is taken by the OR circuit U5, and the delay time detection signal DT2 having a pulse width corresponding to 5$\tau$ which is the delay time from the multi-phase clock Ck1 to the multi-phase clock Ck6 is generated. The delay time detection signal DT2 generated by the OR circuit U5 is output to the D flip-flop FF13, and the delay time detection signal DT2 is latched in synchronization with the reference clock Sref.

When the delay time detection signal DT2 is latched by the D flip-flop FF13, the control signal OV2 depending on the delay time detection signal DT2 is output to the phase detector PD2, and the output of the Up2 signal and the Down2 signal generated by the phase detector PD2 is controlled. For example, when the delay time $\tau$ of the multi-phase clocks Ck1–Ck10 is increased, and gets closer to the locking state with the total delay twice of the period T of the reference clock, the time difference between the edges of the multi-phase clocks Ck1–Ck6 is increased, and the width of the pulse signals D11 and D12 output from each of the RS flip-flop circuits FF11 and FF12 is also increased. Thus, the width of the delay time detection signal DT2 output from the OR circuit U5 is also increased, the delay time detection signal DT2 is latched in synchronization with the reference clock Sref, and the control signal OV2 is output from the D flip-flop FF13.

Here, the phase detector PD2 forcibly outputs the Up2 signal to the charge pump circuit CP2 if the control signal OV2 is output from the D flip-flop FF13, and suppresses the output of the Down2 signal, and increases the control voltage Vc output from the charge pump circuit CP2. As a result, the delay time $\tau$ of each of the voltage controlled delay elements H11–H20 is decreased, and 10$\tau$, which is the total of the delay time $\tau$ of each of the voltage controlled delay elements H11–H20, gets closer to the period T of the reference clock Sref.

Thus, the number of the RS flip-flop circuits FF11 and FF12 for generating the delay time detection signal DT2 can be decreased, locking to the period of n (n=2, 3, 4, . . . ) times of the period T of the reference clock is prevented to enable locking to the period T of the reference clock, and improper locking can be prevented without limiting the frequency f (=1/N) of the reference clock.

FIG. 6 is a timing chart describing the operation of the multi-phase clock generation circuit according to the second embodiment of the present invention in the normal locking state. In FIG. 6, the delay time $\tau$ of each of the voltage controlled delay elements H11–H20 is controlled so that 10$\tau$, which is the total of the delay time $\tau$ of each of the voltage controlled delay elements H1–H20, matches with the period T of the reference clock Sref.

Thus, the delay time $\tau$ of each of the voltage controlled delay elements H11–H20 is given by the formula $\tau$=T/10, and the width of the pulse signals D11 and D12 output from each of the RS flip-flop circuits FF11 and FF12 is 3T/10 and 2T/10, respectively. Hence, the width of the delay time detection signal DT2 output from the OR circuit U5 is 5T/10, and the time Td from the rise of the reference clock Sref to the fall of the delay time detection signal DT2 becomes 6T/10. As a result, at the rise time of the reference clock Sref, the delay time detection signal DT2 is at a low level, and the control signal OV2 output from the D flip-flop FF13 is at the low level.

Thus, the Up3 signal and the Down3 signal output from the phase detector PD3 in FIG. 2 are output to the charge pump circuit CP2 without any change as the Up2 signal and the Down2 signal of the phase detector PD2 in FIG. 5, and the normal locking state can be maintained without any change.

FIG. 7 is a timing chart describing the operation of the multi-phase clock generation circuit according to the second embodiment of the present invention in the unlocking state. In FIG. 7, the delay time $\tau$ of each of the voltage controlled delay elements H11–H20 is longer than T/10, and the multi-phase clock generation circuit is in an unlocking state.

If the delay time τ becomes much longer, and reaches 2T/10, the phase detector PD2 cannot perform discrimination from the state in which the multi-phase clock Ck10 is normally locked to the reference clock Sref, resulting in the possibility of improper locking as shown in FIG. 12. However, as shown in FIG. 7, when the delay time τ of each of the voltage controlled delay elements H11–H20 exceeds T/6, the width 3τ and the width 2τ of the pulse signals D11 and D12 output from each of the RS flip-flop circuits FF11 and FF12 also exceed 3T/6 and 2T/6, respectively, and the width of the delay time detection signal DT2 output from the OR circuit U5 satisfies an inequality 5τ>5T/6.

Thus, the time Td from the rise of the reference clock Sref to the fall of the delay time detection signal DT2 satisfies the inequality 6τ>6T/6=T. As a result, at the rise time of the reference clock Sref, the delay time detection signal DT2 is at a high level, and the control signal OV2 output from the D flip-flop FF13 is at a high level. Thus, this high-level signal is output to the charge pump circuit CP2 via the OR circuit U2 in FIG. 2 as the Up2 signal of the phase detector PD2 in FIG. 5, and the low-level signal obtained by inverting this high-level signal by the inverter U4 is output to the charge pump circuit CP2 via the AND circuit U3 in FIG. 2 as the Down2 signal of the phase detector PD2 in FIG. 5.

Accordingly, the control voltage Vc is increased, the delay time τ of each of the voltage controlled delay elements H11–H20 starts to be shorter, and the multi-phase clock generation circuit gets closer to the normal locking state. Further, if the delay time τ of each of the voltage controlled delay elements H11–H20 becomes shorter, the time Td from the rise of the reference clock Sref to the fall of the delay time detection signal DT2 becomes smaller than the period T of the reference clock Sref, so that the delay time detection signal DT2 is at a low level at the rise time of Sref, and the control signal OV2 is returned at a low level.

Thus, the delay time τ of each of the voltage controlled delay elements H11–H20 does not exceed 2T/10, and the multi-phase clock generation circuit can be normally locked.

As described above, the number of RS flip-flop circuits used for generating the delay time detection signal DT2 can be reduced by detecting the time difference between the edges of the multi-phase clocks Ck11–Ck20 across a plurality of stages according to the above-described second embodiment, and the circuit configuration can be simplified thereby. However, if the RS flip-flop circuit is disposed so as to be across a plurality of voltage control delay elements H11–H20, normal detection cannot be always performed. For example, if the delay 3τ for three stages of the voltage controlled delay elements H12–H14 is allocated to one RS flip-flop circuit FF11, and if 3τ exceeds the period T of the reference clock Sref, the width of the pulse signal D11 detected by this RS flip-flop circuit FF11 is shorter than the desired value by T.

Hence, if M sets of the voltage control delay elements H11–H20 are handled collectively, M·τmax must be smaller than the period T of the reference clock Sref. In other words, the maximum permissible value of the reference clock Sref in this case is reduced to 1/(M·τmax).

FIG. 8 is a block diagram indicating the configuration of a clock multiplication circuit according to an embodiment of the present invention, and FIG. 9 is a timing chart indicating the operation of the clock multiplication circuit according to this embodiment of the present invention.

In FIG. 8, the clock multiplication circuit comprises a multi-phase clock generation circuit CG, RS flip-flop circuits FF21–FF25, and an OR circuit U6. Here, the configuration in FIG. 1 or FIG. 5 can be used in the multi-phase clock generation circuit CG. In this multi-phase clock generation circuit CG, as shown in FIG. 3, the reference signal Sref is input, and the multi-phase clocks Ck1–Ck10 for ten phases with the edges thereof shifted from each other by the 1/10 period are output therefrom.

The multi-phase clocks Ck1 and Ck2 are input to the RS flip-flop circuit FF21, the multi-phase clocks Ck3 and Ck4 are input to the RS flip-flop circuit FF22, the multi-phase clocks Ck5 and Ck6 are input to the RS flip-flop circuit FF23, the multi-phase clocks Ck7 and Ck8 are input to the RS flip-flop circuit FF24, and the multi-phase clocks Ck9 and Ck10 are input to the RS flip-flop circuit FF25, respectively.

The rising edge of each of the multi-phase clocks Ck1–Ck10 is detected by each of the RS flip-flop circuit FF21–FF25, and non-overlap pulses S1–S5 corresponding to the time difference between the edges of the multi-phase clocks Ck1–Ck10 are output as shown in FIG. 9. These non-overlap pulses S1–S5 are output to the OR circuit U6, respectively, and the logical sum of these non-overlap pulses S1–S5 is taken by this OR circuit U6. As a result, the multiplied clock of the frequency five times that of the reference signal Sref is output from the OR circuit U6 as shown in FIG. 9.

The multiplied clock can be generated without using a ring oscillator, generation of low-frequency noise inherent to ring oscillators can be prevented, improper locking can be prevented while mitigating the frequency limit of the reference clock Sref, and a clock multiplication circuit operable at various kinds of frequencies can be provided without changing the design of the multi-phase clock generation circuit CG.

Further, when constituting the clock multiplication circuit using the multi-phase clock generation circuit CG in FIG. 1, the RS flip-flop circuit FF21 in FIG. 8 is commonly used as the RS flip-flop circuit FF1 in FIG. 1, the RS flip-flop circuit FF22 in FIG. 8 is commonly used as the RS flip-flop circuit FF3 in FIG. 1, the RS flip-flop circuit FF23 in FIG. 8 is commonly used as the RS flip-flop circuit FF5 in FIG. 1, and the number of the RS flip-flop circuits can be reduced, thereby simplifying the circuit configuration.

As described above, according to the present invention, the delay time of the voltage controlled delay element can be limited to a predetermined value or less, and improper locking can be prevented while mitigating the limitation imposed on the reference clock frequency, resulting in various kinds of applications without changing the design of the multi-phase clock generation circuit.

The entire disclosure of Japanese Application No. 2002-045243, filed Feb. 21, 2002 is incorporated by reference.

What is claimed is:

1. A multi-phase clock generation circuit comprising:
   voltage controlled delay elements of N stages connected in cascade wherein N is an integer that is greater than 1;
   delay time control means for controlling a delay time of an output signal of each stage of said voltage controlled delay elements so that a phase of the output signal from the N-th stage of said voltage controlled delay elements matches a phase of a reference clock input in the first stage of said voltage controlled delay elements;
   delay time detection means for receiving time differences between said output signals of each stage and for generating delay time signals corresponding to time differences between output signals of consecutive ones of said stages;
a delay time monitoring means for receiving said delay time signals and for monitoring the delay time of said voltage controlled delay elements based on said delay time signals; and
a Locking condition control means for controlling a locking condition of the output signals of said voltage controlled delay elements based on a delay time monitoring result by said delay time monitoring means.

2. A multi-phase clock generation circuit according to claim 1, wherein the locking condition of the output signals of said voltage controlled delay elements is controlled so that a total delay time of the N stages of said voltage controlled delay elements matches with one period of the reference clock.

3. A multi-phase clock generation circuit according to claim 1, wherein a maximum delay time for one set of said voltage controlled delay element is shorter than one period of said reference clock.

4. A multi-phase clock generation circuit comprising:
voltage controlled delay elements of N stages connected in cascade, wherein N is an integer that is greater than 1;
a phase detector circuit for controlling a delay time of an output signal of each stage of said voltage controlled delay elements so that a phase of the output signal from the N-th stage of the voltage controlled delay elements matches a phase of a reference clock input in the first stage of the voltage controlled delay elements;
a delay time detection circuit for detecting a delay time for K stages (K<N, wherein K is an integer) of said voltage controlled delay elements based on time differences between output signals of consecutive ones of said K stages;
a delay time decision circuit for deciding if the delay time detected by said delay time detection circuit is within one period of said reference clock; and
a delay time reduction circuit for reducing the delay time to be controlled by said phase detector circuit when the delay time detected by said delay time detection circuit exceeds one period of said reference clock.

5. A multi-phase clock generation circuit according to claim 4, wherein said K is larger than N/2.

6. A multi-phase clock generation circuit according to claim 4, wherein said delay time detection circuit detects a period of delay from a time a first pulse of said reference clock is input to an (i+1)-th voltage controlled delay element to a time said first pulse is output from an (i+K−1)-th voltage controlled delay element, and reduces the delay time to be controlled by said phase detector circuit when a second pulse following said first pulse is input to an i-th voltage controlled delay element during the detected period of delay, wherein i is an integer corresponding to a first one of said stages.

7. A multi-phase clock generation circuit according to claim 6, wherein said delay time detection circuit comprises (K−1) sets of RS flip-flop circuits for detecting the delay time for each stage of (K−1) stages from the (i+1)-th stage to the (i+K−i) stage of said voltage controlled delay elements, and an OR circuit for taking a logical sum of the delay time of each stage detected by said RS flip-flop circuits.

8. A multi-phase clock generation circuit according to claim 7, wherein said delay time decision circuit further comprises:
a D flip-flop for latching the output of said OR circuit in synchronization with the pulses input to said i-th voltage controlled delay element.

9. A multi-phase clock generation circuit according to claim 8, wherein said delay time reduction circuit continues to reduce the delay time controlled by said phase detector circuit for a period in which the output of said D flip-flop is at a high level.

10. A multi-phase clock generation circuit according to claim 6, wherein said delay time detection circuit further comprises:
M sets of RS flip-flop circuits for detecting a delay time for groups in which said voltage controlled delay elements of (K−1) stages are divided into M sets (1≦M<K−1); and
an OR circuit for taking a logical sum of the delay time of each group detected by said RS flip-flop circuits.

11. A multi-phase clock generation circuit according to claim 10, wherein a maximum delay time for one set of the groups is shorter than one period of said reference clock.

12. A multi-phase clock generation circuit according to claim 10, wherein said delay time decision circuit further comprises:
a D flip-flop for latching the output of said OR circuit in synchronization with the pulses input to said i-th voltage controlled delay element.

13. A multi-phase clock generation circuit according to claim 12, wherein said delay time reduction circuit continues to reduce the delay time controlled by said phase detector circuit for a period in which the output of said D flip-flop is at a high level.

14. A multi-phase clock generation circuit according to claim 4, wherein a maximum delay time for one set of said voltage controlled delay element is shorter than one period of said reference clock.

15. A clock multiplication circuit including a multi-phase clock generation circuit for generating multi-phase clocks, and a multiplied clock generation circuit for generating the multiplied clock based on said multi-phase clocks, said multi-phase clock generation circuit comprising:
voltage controlled delay elements of N stages connected in cascade;
a phase detector circuit for controlling a delay time of an output signal of each stage of said voltage controlled delay elements so that a phase of the output signal from the N-th stage of said voltage controlled delay elements matches a phase of a reference clock;
a delay time detection circuit for detecting a delay time for K(K<N) stages of said voltage controlled delay elements based on time differences between output signals of consecutive ones of said K stages;
a delay time decision circuit for deciding if the delay time detected by said delay time detection circuit is within one period of said reference clock; and
a delay time reduction circuit for reducing the delay time to be controlled by said phase detector circuit when the delay time detected by said delay time detection circuit exceeds one period of said reference clock.

* * * * *